US012193222B2

(12) United States Patent
Li et al.

(10) Patent No.: US 12,193,222 B2
(45) Date of Patent: Jan. 7, 2025

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei (CN)

(72) Inventors: Ran Li, Hefei (CN); Leilei Duan, Hefei (CN); Xing Jin, Hefei (CN); Ming Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 596 days.

(21) Appl. No.: 17/580,771

(22) Filed: Jan. 21, 2022

(65) Prior Publication Data
US 2023/0033022 A1 Feb. 2, 2023

Related U.S. Application Data

(63) Continuation of application No. PCT/CN2021/112299, filed on Aug. 12, 2021.

(30) Foreign Application Priority Data

Jul. 27, 2021 (CN) .......................... 202110853181.2

(51) Int. Cl.
*H10B 12/00* (2023.01)
(52) U.S. Cl.
CPC ........... *H10B 12/50* (2023.02); *H10B 12/033* (2023.02); *H10B 12/312* (2023.02)

(58) Field of Classification Search
None
See application file for complete search history.

(56) References Cited

U.S. PATENT DOCUMENTS

| | | | |
|---|---|---|---|
| 2015/0340281 A1* | 11/2015 | Lee | H01L 21/76895 438/618 |
| 2021/0066304 A1* | 3/2021 | Kang | G11C 7/18 |
| 2021/0125930 A1* | 4/2021 | Shin | H01L 23/5226 |
| 2022/0037335 A1* | 2/2022 | Ma | H10B 12/482 |
| 2022/0139921 A1* | 5/2022 | Kim | H10B 12/315 257/532 |
| 2022/0189967 A1* | 6/2022 | Kim | H10B 12/482 |
| 2022/0189968 A1* | 6/2022 | Park | H10B 12/50 |

FOREIGN PATENT DOCUMENTS

| | | |
|---|---|---|
| CN | 107895721 A | 4/2018 |
| CN | 108206184 A | 6/2018 |
| CN | 211017076 U | 7/2020 |

\* cited by examiner

*Primary Examiner* — Michelle Mandala
(74) *Attorney, Agent, or Firm* — Kilpatrick Townsend & Stockton LLP (57) ABSTRACT

The embodiment of the application provides a semiconductor structure and a method for forming a semiconductor structure. The method includes: a substrate structure is provided, in which the substrate structure at least including bit line structures and a plurality of landing pads, each of the plurality of landing pads is formed around a respective one of the bit line structures and covers a part of the respective one of the bit line structures, and a gap is formed between each two adjacent landing pads of the plurality of landing pads; and capacitive structures are formed on top surfaces of the plurality of landing pads and in the gaps.

17 Claims, 11 Drawing Sheets

A substrate structure is provided, in which the substrate structure at least comprises bit line structures and a plurality of landing pads, each of the plurality of landing pads is formed around a respective one of the bit line structures and covers a part of the respective one of the bit line structures, and a gap is formed between each two adjacent landing pads of the plurality of landing pads — S101

Capacitive structures are formed on top surfaces of the plurality of landing pads and in the gaps — S102

SEMICONDUCTOR STRUCTURE AND METHOD FOR FORMING SEMICONDUCTOR STRUCTURE

CROSS-REFERENCE TO RELATED APPLICATIONS

This application is a continuation application of International Patent Application No. PCT/CN2021/112299, filed on Aug. 12, 2021, which is based upon and claims priority to Chinese Patent Application No. 202110853181.2, filed on Jul. 27, 2021 and entitled "SEMICONDUCTOR STRUCTURE AND METHOD FOR FORMING SEMICONDUCTOR STRUCTURE". The contents of International Patent Application No. PCT/CN2021/112299 and Chinese Patent Application No. 202110853181.2 are hereby incorporated by reference in their entireties.

TECHNICAL FIELD

The embodiment of the application relates, but is not limited, to a semiconductor structure and a method for forming a semiconductor structure.

BACKGROUND

A Dynamic Random Access Memory (DRAM) is a commonly used semiconductor memory device in computers, and includes many repetitive memory cells. Each of the memory cells includes a transistor and a capacitor. The gate of the transistor is connected with a word line, the drain of the transistor is connected with a bit line, and the source of the transistor is connected with the capacitor. Voltage signals on the word line may control the transistor to be turned on or turned off, so that the data information stored in the capacitor may be read through the bit line, or the data information may be written into the capacitor through the bit line for storage.

With the continuous development of a semiconductor integrated circuit device technology and the gradual reduction of the line width, for the DRAM, it is particularly important to increase the charge capacity of the capacitor and reduce the electric leakage. However, in the manufacturing process of the DRAM, simply increasing the height of the capacitor will greatly increase the difficulty of capacitor etching, which in turn increases the difficulty of the manufacturing process of a semiconductor device.

SUMMARY

The embodiment of the application provides a method for forming a semiconductor structure, including the following operations. A substrate structure is provided. The substrate structure at least includes bit line structures and a plurality of landing pads, each of the plurality of landing pads is formed around a respective one of the bit line structures and covers a part of the respective one of the bit line structures, and a gap is formed between each two adjacent landing pads of the plurality of landing pads. Capacitive structures are formed on top surfaces of the plurality of landing pads and in the gaps.

The embodiment of the application provides a semiconductor structure, including a substrate structure and capacitive structures. The substrate structure at least includes bit line structures and a plurality of landing pads, each of the plurality of landing pads is formed around a respective one of the bit line structures and covers a part of the respective one of the bit line structures, and a gap is formed between each two adjacent landing pads of the plurality of landing pads. The capacitive structures are located on top surfaces of the plurality of landing pads and in the gaps.

BRIEF DESCRIPTION OF THE DRAWINGS

In the drawings (which are not necessarily drawn to scale), similar reference numerals may describe similar parts in different figures. Similar reference numerals with different letter suffixes may represent different examples of similar parts. The drawings generally illustrate the various embodiments discussed herein by way of examples rather than limitation.

DETAILED DESCRIPTION

Exemplary implementation modes of the application will be described below more comprehensively with reference to the drawings. Although the exemplary implementation modes of the application are shown in the drawings, it should be understood that, the application may be implemented in various forms and should not be limited by the specific implementation modes elaborated herein. On the contrary, these implementation modes are provided to enable a more thorough understanding of the application and to fully convey the scope of the disclosure of the application to those skilled in the art.

In the following description, a large number of specific details are given in order to provide a more thorough understanding of the application. However, it will be apparent to those skilled in the art that the application may be implemented without one or more of these details. In other examples, in order to avoid confusion with the application, some technical features known in the art are not described. That is, all the features of the actual embodiments are not described here, and the known functions and structures are not described in detail.

In the drawings, the dimensions of layers, areas and elements and their relative dimensions may be exaggerated for clarity. Throughout, the same reference numerals represent the same elements.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers and/or parts may be described with terms first, second, third, etc., these elements, components, areas, layers and/or parts should not be limited to these terms. These terms are used only to distinguish one element, component, area, layer or part from another element, component, area, layer or part. Therefore, a first element, component, area, layer or part discussed below may be represented as a second element, component, area, layer or part without departing from the teaching of the application. However, when the second element, component, area, layer or part is discussed, it does not mean that the first element, component, area, layer or part must exist in the application.

The terms used herein are intended only to describe specific embodiments and are not a limitation of the application. As used herein, singular forms "a/an", "one", and "the" may also be intended to include the plural forms, unless otherwise specified types in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, term "and/or" includes any and all combinations of the related listed items.

In a DRAM process technology, it is more and more difficult to increase the process integration of a semiconductor process and reduce the component size. Especially, in an array process of a DRAM, the process flow of each device needs to overcome a series of process problems and some problems that may be avoided in the connection of the process flow. However, in the manufacturing process of the DRAM, simply increasing the height of a capacitor will greatly increase the difficulty of capacitor etching.

The embodiment of the application provides a semiconductor structure and a method for forming a semiconductor structure. A semiconductor structure with relatively large charge capacity may be manufactured through the method for forming a semiconductor device provided in the embodiment of the application.

Figure 1:
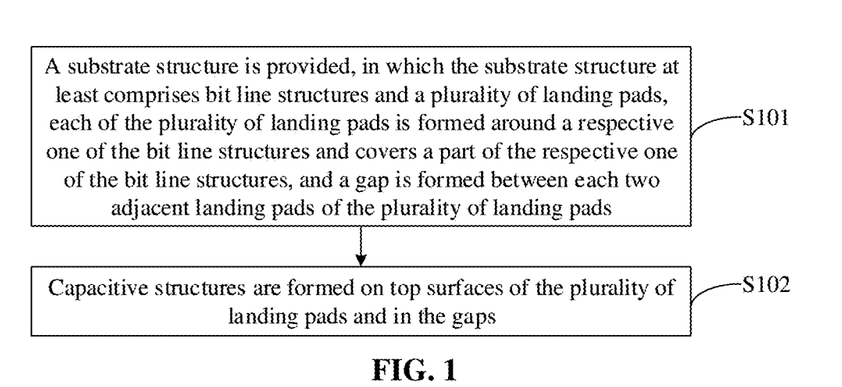
FIG. 1 is an optional schematic flowchart diagram of a method for forming a semiconductor structure according to an embodiment of the application.

FIG. 1 is an optional schematic diagram of a method for forming a semiconductor structure provided in the embodiment of the application. As shown in FIG. 1, the method may include the following operations.

At S101, a substrate structure is provided, in which the substrate structure at least includes bit line structures and a plurality of landing pads, each of the plurality of landing pads is formed around a respective one of the bit line structures and covers a part of the respective one of the bit line structures, and a gap is formed between each two adjacent landing pads of the plurality of landing pads.

In some embodiments, the substrate structure may also include a semiconductor substrate, the bit line structures are formed on a surface of the semiconductor substrate. In an embodiment of the application, the substrate structure may include a plurality of bit line structures arranged in parallel. Herein, the semiconductor substrate may be a silicon substrate, and the semiconductor substrate may also include other semiconductor elements, such as germanium (Ge), or semiconductor compounds, such as silicon carbide (SiC), gallium arsenide (GaAs), gallium phosphide (GaP), indium phosphide (InP), indium arsenide (InP) or indium antimonide (InSb), or other semiconductor alloys, such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP) or a combination thereof.

The semiconductor substrate may include a top surface on the front and a bottom surface on the back opposite to the front. In the case of ignoring the flatness of the top surface and the bottom surface, a direction perpendicular to the top surface and the bottom surface of the semiconductor substrate is defined as a first direction. A second direction and a third direction intersecting with each other (e.g., perpendicular to each other) are defined with respect to the direction of the top surface and the bottom surface of the semiconductor substrate (i.e., the plane where the semiconductor substrate is located). For example, the arrangement direction of a plurality of bit line structures may be defined as the second direction, the extension direction of the bit line structures may be defined as the third direction, and the direction of the plane where the semiconductor substrate is located may be determined based on the second direction and the third direction. Here, any two of the first direction, the second direction and the third direction are perpendicular to each other. In the embodiment of the application, the first direction is defined as the Z-axis direction, the second direction is defined as the X-axis direction, and the third direction is defined as the Y-axis direction.

In the embodiment of the application, the landing pads are configured to be electrically connected to capacitive structures formed later, and a gap is formed between two adjacent landing pads. Here, the two adjacent landing pads refer to the two adjacent landing pads along the arrangement direction (i.e., the second direction) of the bit line structures.

At S102, capacitive structures are formed on top surfaces of the plurality of the landing pads and in the gaps.

In the embodiment of the application, each capacitive structure may be a capacitor with a cup-shape.

In the embodiment of the application, since the capacitive structures may be not only formed on the upper surfaces of the landing pads, but also formed in the gaps between adjacent landing pads. In this way, a semiconductor structure with relatively large charge capacity may be manufactured.

FIG. 2A to FIG. 2K are schematic flowchart diagrams illustrating the formation of a semiconductor substrate according to an embodiment of the application. The method for forming the semiconductor structure provided in the embodiment of the application will be further described in detail below with reference to FIG. 2A to FIG. 2K.

Figure 2A:
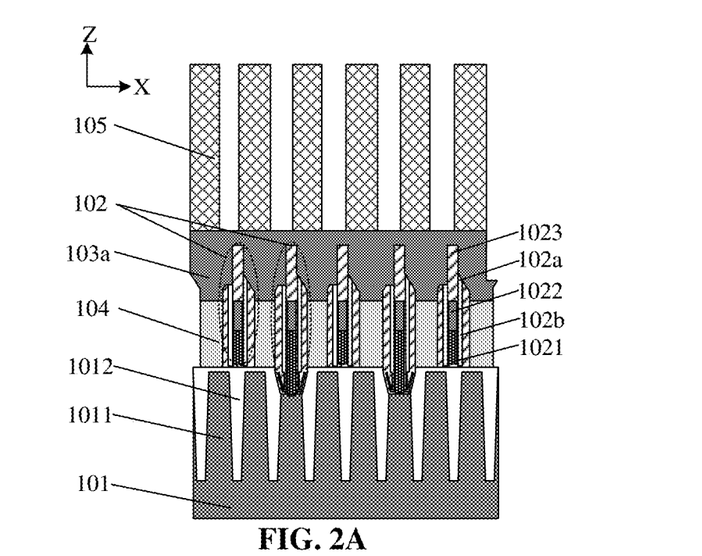
FIG. 2A to FIG. 2K are schematic diagrams of a semiconductor structure in a process of forming the semiconductor structure according to an embodiment of the application.
Figure 2B:
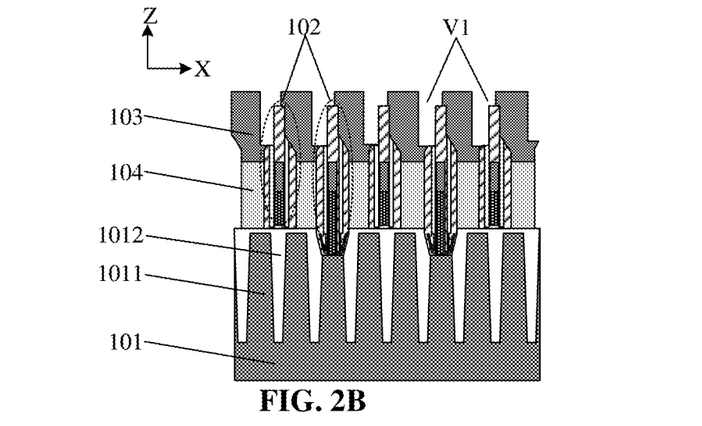

At first, with reference to FIG. 2A and FIG. 2B, S101 is executed. A substrate structure is provided, in which the substrate structure at least includes bit line structures and a plurality of landing pads, each of the plurality of landing pads is formed around a respective one of the bit line structures and covers a part of the respective one of the bit line structures, and a gap is formed between each two adjacent landing pads of the plurality of landing pads.

As shown in FIG. 2A to FIG. 2B, the substrate structure includes a semiconductor substrate 101 and a plurality of bit line structures 102 formed on a surface of the semiconductor substrate 101. Herein, the semiconductor substrate 101 includes a plurality of active areas 1011 in array pattern and a shallow trench isolation structure 1012 configured to isolate the active areas 1011 from each other. The bit line structures 102 are formed on the surfaces of the active areas 1011 and are in contact with the active areas 1011 through bit line contact structures. The substrate structure also includes a plurality of landing pads (LP) 103, each of the plurality of landing pads is formed around a respective one of the bit line structures and covers a part of the respective one of the bit line structures, and a gap V1 is formed between each two adjacent landing pads 103 of the plurality of landing pads along the X-axis direction.

Each bit line structure 102 may include a bit line contact layer 1021, a bit line metal layer 1022 and a bit line mask layer 1023 which are sequentially arranged onto one another from bottom to top along the Z-axis direction. The material of the bit line contact layer 1021 may be polysilicon. The material of the bit line metal layer 1022 may include tungsten (W), cobalt (Co), copper (Cu), aluminum (Al), polysilicon, doped silicon, silicide or any combination thereof. The material of the bit line mask layer may be silicon nitride.

In some embodiments, the substrate structure also includes a word line structure (not shown in the figure) buried in the semiconductor substrate 101 and a first spacer layer, a sacrificial spacer layer 102a and a second spacer layer 102b sequentially formed on the side wall of each bit line structure 102. The dimensions of the first spacer layer, the sacrificial spacer layer 102a and the second spacer layer 102b are sequentially reduced along the Z-axis direction.

In some embodiments, the substrate structure also includes a storage Node Contact (NC) 104, and each of the storage node contacts is formed around a respective one of the bit line structures 102 and is in contact with a respective one of the plurality of landing pads 103. The plurality of landing pads and the gaps may be formed by the following operations.

At S1011, a conductive layer covering the bit line structures is formed on a surface of each storage node contact, in which a top surface of the conductive layer exceeds a top surface of each bit line structure.

As shown in FIG. 2A, a conductive layer 103a covering the bit line structures 102 is formed on the surface of each storage node contact 104, in which the top surface of the conductive layer 103a exceeds the top surface of each bit line structure 102.

In the embodiment of the application, the conductive layer may be formed by any suitable deposition process, such as a Chemical Vapor Deposition (CVD) process, a Physical Vapor Deposition (PVD) process, an Atomic Layer Deposition (ALD) process, a spin coating process or a coating process.

At S1012, a patterned second mask layer is formed on a surface of the conductive layer.

Please with reference to FIG. 2A, a patterned second mask layer 105 is formed on the surface of the conductive layer 103a. The patterned second mask layer 105 is provided with a plurality of openings, and each opening exposes the top surface of a part of the conductive layer 103a.

In some embodiments, the second mask layer may be an Amorphous Carbon Layer (ACL), a Spin-on Hard mask (SOH), a polysilicon layer or a silicon oxynitride layer.

At S1013, a part of the conductive layer and a part of the first spacer layer are etched through the patterned second mask layer until the sacrificial spacer layer is exposed, to form the plurality of landing pads on surfaces of the storage node contacts and the gaps between adjacent landing pads.

As shown in FIG. 2B, a part of the conductive layer 103a and a part of the first spacer layer are etched through the openings of the patterned second mask layer 105 until the sacrificial spacer layer 102a is exposed, to form the plurality of landing pads 103 on the surfaces of the storage node contacts 104 and the gaps V1 located between adjacent landing pads.

The gap V1 located between adjacent landing pads formed in the embodiment of the application has a stepped cross section along the XZ direction, herein, the Z-axis direction (i.e., the first direction) is perpendicular to the extension direction (i.e., the third direction) of the bit line structures and the arrangement direction (i.e., the second direction) of the bit line structures.

Next, with reference to FIG. 2C to FIG. 2K, S102 is executed. The capacitive structures are formed on the top surfaces of the plurality of landing pads and in the gaps.

In some embodiments, S102 may include the following operations.

Figure 2C:
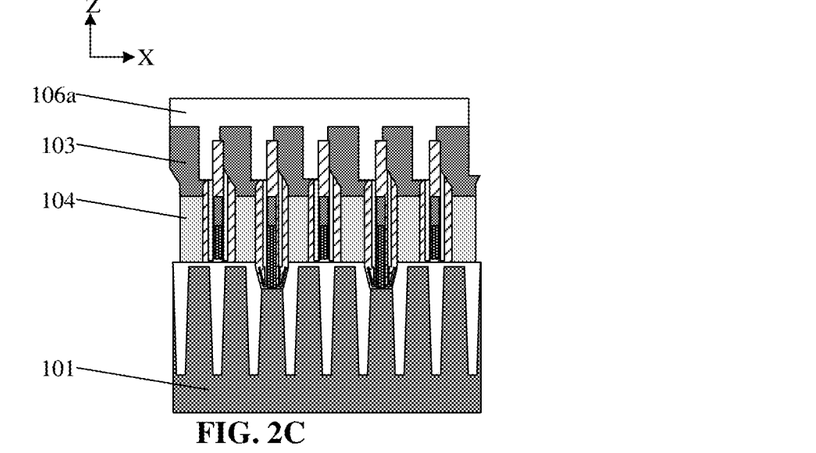
Figure 2D:
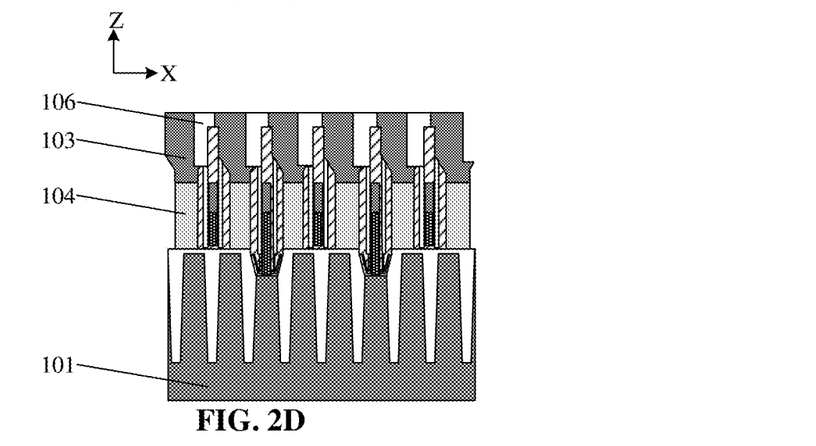

At S1021, first insulating layers are formed in the gaps, in which the first insulating layers are flush with surfaces of the landing pads.

As shown in FIG. 2C and FIG. 2D, firstly, the gaps V1 are filled with an insulating material to form an initial insulating layer 106a. Due to the influence of a process, the initial insulating layer 106a usually covers the surfaces of the landing pads 103. Secondly, the initial insulating layer 106a is processed through dry etching or Chemical Mechanical Polishing (CMP) to expose the surfaces of the landing pads 103. In this way, the first insulating layers 106 are formed in the gaps V1. In the embodiment of the application, the first insulating layers may be a silicon oxide layer.

Figure 2E:
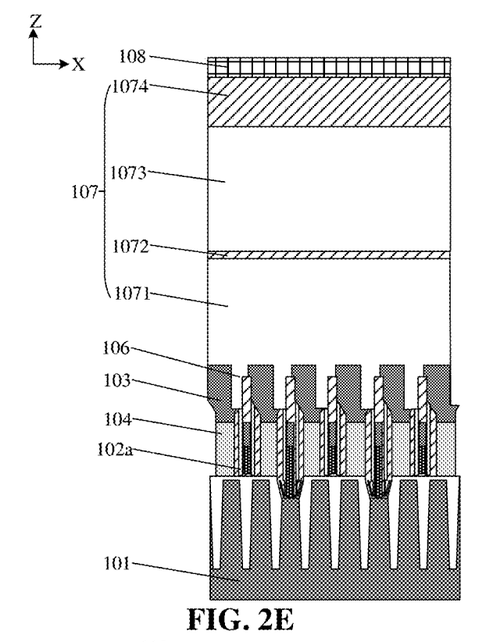

At S1022, a stack structure is formed on the surfaces of the plurality of landing pads and surfaces of the first insulating layers.

In the embodiment of the application, the stack structure includes a sacrificial layer and a supporting layer, herein, the sacrificial layer and the supporting layer are alternately stacked onto one another along the Z-axis direction. The sacrificial layer may be an oxide layer, such as a silicon oxide layer. The supporting layer may be a nitride layer, such as a silicon nitride layer. Here, the stack structure may be formed by any suitable deposition process.

As shown in FIG. 2E, a stack structure 107 is formed on the surfaces of the landing pads 103 and the surfaces of the first insulating layers 106. In the embodiment of the application, the stack structure 107 may include a first sacrificial layer 1071, a first supporting layer 1072, a second sacrificial layer 1073 and a second supporting layer 1074 sequentially stacked onto one another from bottom to top along the Z-axis direction.

At S1023, the stack structure and the first insulating layers are processed to form the capacitive structures.

In some embodiments, S1023 may be achieved through the following operations.

At S1, the stack structure is patterned to form capacitive holes in the stack structure on the surfaces of the plurality of landing pads.

In some embodiments, before S1 is executed, the method for forming the semiconductor structure also includes the following operation. A first mask layer is formed on a surface of the second supporting layer.

Please with reference to FIG. 2E, a first mask layer 108 is formed on the surface of the second supporting layer 1074. The material of the first mask layer 108 may be the same as or different from the material of the patterned second mask layer 105.

In some embodiments, S1 may be achieved through the following operations.

At S11, the first mask layer is patterned.

Figure 2F:
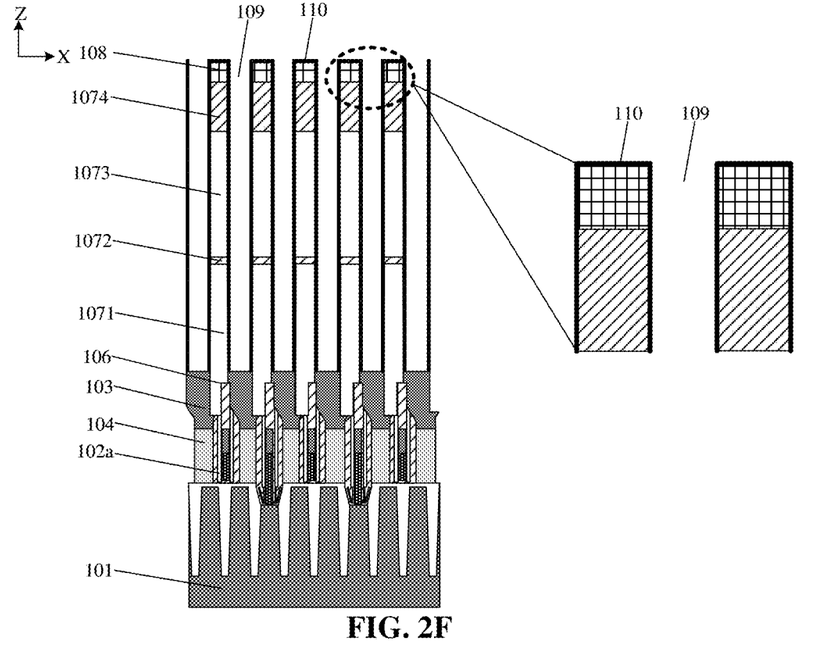

At S12, the second supporting layer, the second sacrificial layer, the first supporting layer and the first sacrificial layer on the surfaces of the plurality of landing pads are etched by using the patterned first mask layer as a mask to form a plurality of capacitive holes.

As shown in FIG. 2F, the second supporting layer 1074, the second sacrificial layer 1073, the first supporting layer 1072 and the first sacrificial layer 1071 located on the surfaces of the plurality of landing pads 103 are etched through the patterned first mask layer to form a plurality of capacitive holes 109.

At S2, first electrode layers are formed on inner walls of the capacitive holes and on a surface of the patterned stack structure.

Please with reference to FIG. 2F, first electrode layers 110 are formed on the inner walls of the capacitive holes 109 and on the surface of the patterned stack structure. In the embodiment of the application, the first electrode layer 110 may be a titanium nitride layer.

At S3, the supporting layer is patterned to form openings between adjacent capacitive holes.

At S4, the sacrificial layer and the first insulating layers are etched through the openings.

In some embodiments, the patterned stack structure includes the first sacrificial layer, the first supporting layer, the second sacrificial layer and the second supporting layer stacked onto one another, and the first mask layer and the first electrode layers are formed on the surface of the patterned stack structure. S3 and S4 may be achieved through the following operations.

Figure 2G:
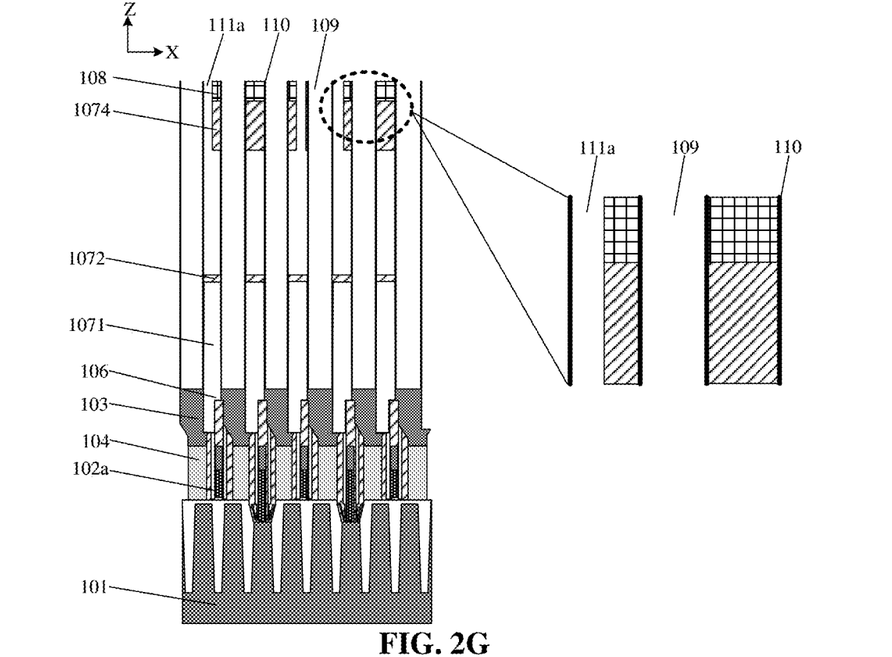

A first opening is formed in the first mask layer and the second supporting layer.

The second sacrificial layer is removed through the first opening.

As shown in FIG. 2G, a first opening 111*a* is formed in the first mask layer 108 and the second supporting layer 1074 by using a conventional etching process, and the second sacrificial layer 1073 is removed through the first opening 111*a*. In the embodiment of the application, the second sacrificial layer 1073 may be removed by using a wet etching solution through a wet etching process. In the embodiment of the application, when the first opening 111*a* is formed, the first electrode layers located on the top surface of the first mask layer 108 are removed.

Figure 2H:
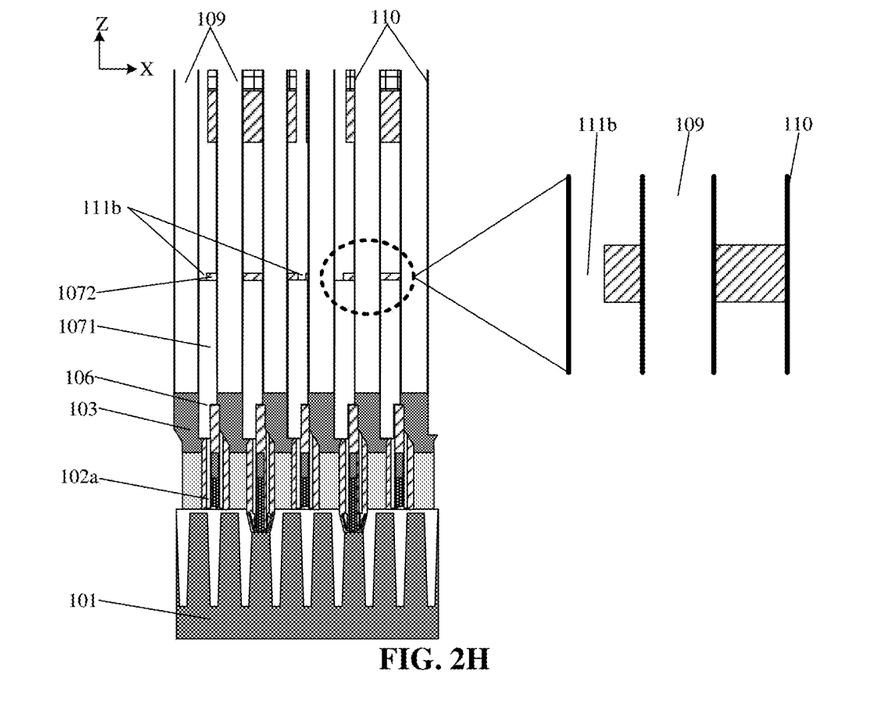
Figure 2I:
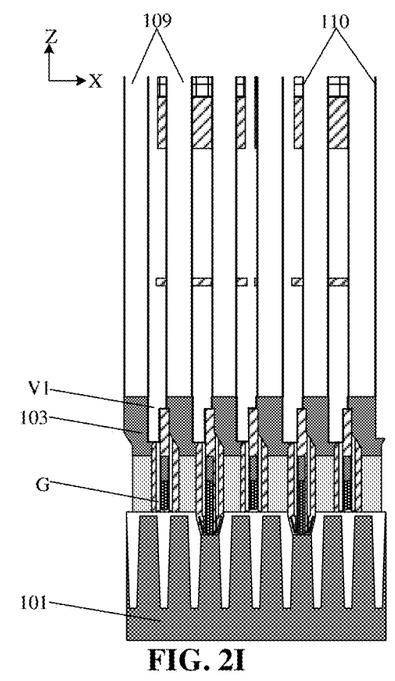

A second opening is formed in the first supporting layer.

The first sacrificial layer and the first insulating layer are removed through the second opening.

As shown in FIG. 2H and FIG. 2I, a second opening 111*b* is formed in the second supporting layer 1074 by using the conventional etching process, and the first sacrificial layer 1071 and the first insulating layer 106 are removed through the second opening 111*b*. In the embodiment of the application, the first sacrificial layer 1071 and the first insulating layer 106 are removed by using the wet etching solution through the wet etching process.

In some embodiments, the second sacrificial layer 1073 and the first insulating layer 106 may be made of the same material or different materials.

In the embodiment of the application, the first opening 111*a* and the second opening 111*b* may be formed by dry etching process, such as a plasma etching process.

In some embodiments, a side wall of each bit line structure 102 is formed with a first spacer layer, a second spacer layer 102*a* and a sacrificial spacer layer 102*b* located between the first spacer layer and the second spacer layer, and the first insulating layer 106 is connected with the sacrificial spacer layer 102*a*. The method for forming the semiconductor structure also includes the following operation. The sacrificial spacer layer is removed when the first sacrificial layer and the first insulating layer are removed through the second opening. The first sacrificial layer and the sacrificial spacer layer are formed of the same material.

Please with reference to FIG. 2I, a sacrificial spacer layer 102*a* on the side wall of each bit line structure 102 is removed when the first sacrificial layer 1071 and the first insulating layer 106 are removed, to form an air gap G located on the side wall of each bit line structure. The air gap G communicates with the gap V1, and the air gap G may reduce the electric leakage of the semiconductor structure.

In some embodiments, the second sacrificial layer, the first sacrificial layer, the first insulating layer and the first spacer layer may be removed through etching solutions, such as sulfuric acid, hydrofluoric acid and nitric acid, by a wet etching process.

At S5, the capacitive structures are formed in the patterned supporting layer.

In some embodiments, S5 may be achieved through the following operations.

Figure 2J:
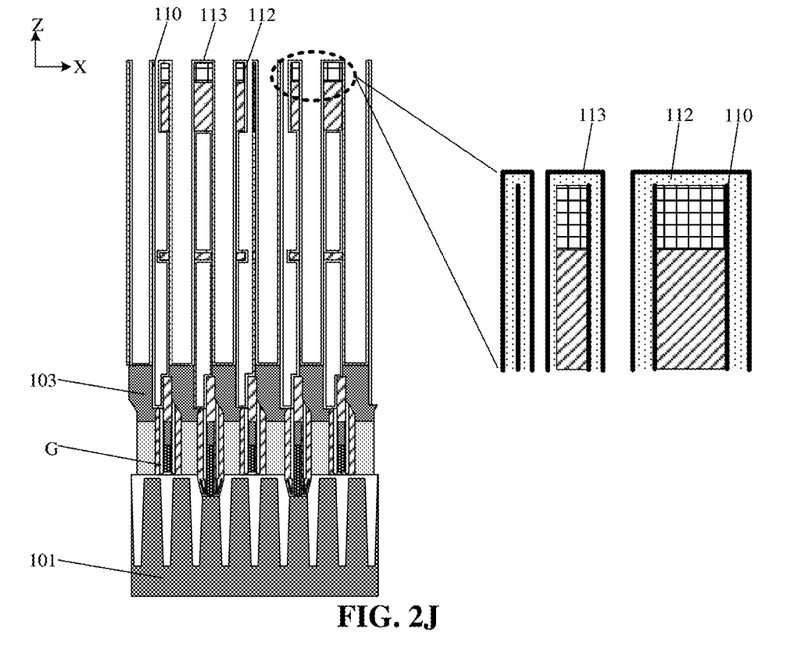

Dielectric layers and second electrode layers are sequentially deposited on surfaces of the first electrode layers.

As shown in FIG. 2J, dielectric layers 112 and second electrode layers 113 are formed on the surfaces of the first electrode layers, and the dielectric layers 112 and the second electrode layers 113 are also configured to seal the air gap G. In the embodiment of the application, the dielectric layer 112 may be a zirconium oxide layer and/or an aluminum oxide layer, or other material layers with a high dielectric constant. The second electrode layer 113 may be the same as or different from the first electrode layer 110.

Figure 2K:
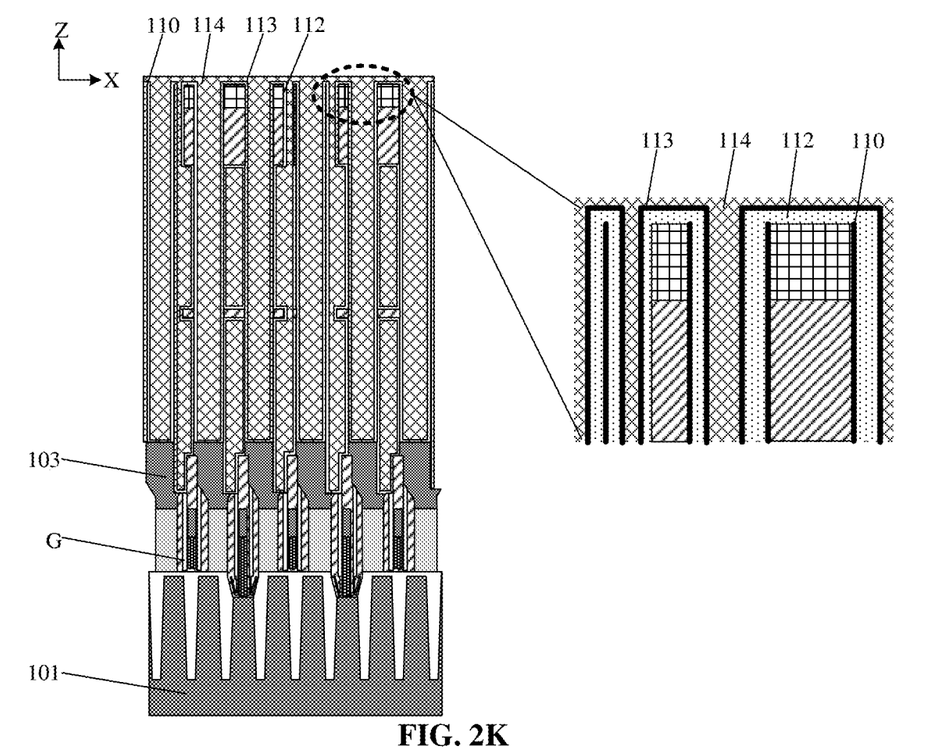

A conductive material that fills a clearance between the second electrode layers and covers an upper surface of the stack structure is deposited. The first electrode layers, the dielectric layers, the second electrode layers and the conductive material form the capacitive structures.

As shown in FIG. 2K, a conductive material 114 is deposited in a clearance between the second electrode layers to form complete capacitive structures. The capacitive structures may include the first electrode layers 110, the dielectric layers 112, the second electrode layers 113 and the conductive material 114.

In the embodiment of the application, the conductive material may be polysilicon or any other suitable conductive material, such as tungsten, cobalt or doped polysilicon.

In the method for forming the semiconductor structure provided in the embodiment of the application, since the capacitive structures are also formed in the gaps between adjacent landing pads, the semiconductor structure with relatively large charge capacity may be manufactured. Moreover, when the capacitive structures are formed in the semiconductor structure in the embodiment of the application, air gaps located on the side walls of the bit line structures are formed, so that the electric leakage performance of the semiconductor structure may be improved.

In the embodiment of the application, by using an NON structure of two devices including a bit line (BL) and a bit line contact (BLC), a manufacturing process of increasing capacitance and an air gap to reduce electric leakage is designed. Through the over etching of the landing pads, the insulating material (such as $SiO_2$) is filled around the landing pads, On the basis of the traditional capacitor, a BL/BLC/LP air gap structure formed integrally is formed by acid pickling (such as hydrofluoric acid), and TIN/ZrO is deposited in the gaps between the landing pads to increase the charge capacity of the capacitor.

FIG. 3A to FIG. 3I are other schematic flowchart diagrams illustrating the formation of the semiconductor substrate according to an embodiment of the application. The method for forming the semiconductor structure provided in the embodiment of the application will be further described in detail below with reference to FIG. 3A to FIG. 3I.

Figure 3A:
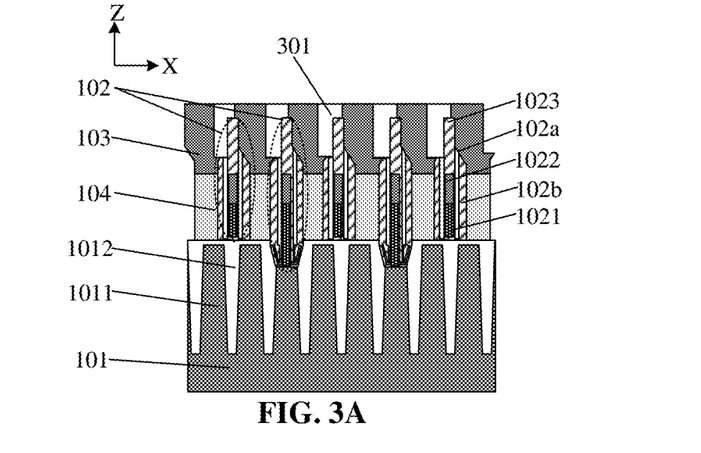
FIG. 3A to FIG. 3I are other schematic diagrams of a semiconductor structure in a process of forming the semiconductor structure according to an embodiment of the application.
Figure 3B:
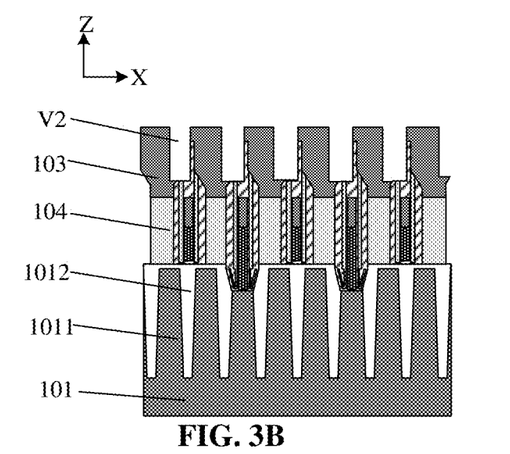

At first, with reference to FIG. 3A and FIG. 3B, S101 is executed. A substrate structure is provided, in which the substrate structure at least includes bit line structures and a plurality of landing pads, each of the plurality of landing pads is formed around a respective one of the bit line structures and covers a part of the respective one of the bit line structures, and a gap is formed between each two adjacent landing pads of the plurality of landing pads.

As shown in FIG. 3A, the substrate structure includes a semiconductor substrate 101 and a plurality of bit line structures 102 formed on a surface of the semiconductor substrate 101. Herein, the semiconductor substrate 101 includes a plurality of active areas 1011 and shallow trench isolation structures 1012 alternately arranged along the X-axis direction. Each bit line structure 102 includes a bit line contact layer 1021, a bit line metal layer 1022 and a bit line mask layer 1023 sequentially stacked onto one another from bottom to top along the Z-axis direction. The substrate structure also includes a first spacer layer, a sacrificial spacer layer 102a and a second spacer layer 102b sequentially formed on the side wall of each bit line structure 102. The dimensions of the first spacer layer, the sacrificial spacer layer 102a and the second spacer layer 102b are sequentially reduced along the Z-axis direction. The substrate structure also include a plurality of landing pads 103, each of the plurality of landing pads is formed around a respective one of the bit line structures 102 and covers a part of the respective one of the bit line structures 102.

In some embodiments, the gaps between adjacent landing pads may be formed through the following operations.

At S301, a second insulating layer is formed between each two adjacent landing pads of the plurality of landing pads, in which the second insulating layer is flush with the surfaces of the plurality of landing pads.

Please with reference to FIG. 3A, a second insulating layer 301 is formed between each two adjacent landing pads 103, in which the surface of the second insulating layer 301 is flush with the surfaces of the plurality of landing pads 103. Herein, the second insulating layer may be a silicon oxide layer or other insulating layers.

At S302, the second insulating layer and a part of the bit line mask layer are etched to form the gaps, in which the section of each gap along the first direction is U-shaped.

Herein, the second insulating layer and the bit line mask layer may be etched by a dry etching process or a wet etching process. As shown in FIG. 3B, the second insulating layer 301 and a part of the bit line mask layer 1023 are etched and removed along the Z-axis direction to form a gap V2 between each two adjacent landing pads 103 along the Z-axis direction, and the section of each gap V2 along the XZ direction is U-shaped.

Next, with reference to FIG. 3C to FIG. 3I, S102 is executed. Capacitive structures are formed on the top surfaces of the plurality of landing pads and in the gaps.

In some embodiments, S102 may include the following operations.

Figure 3C:
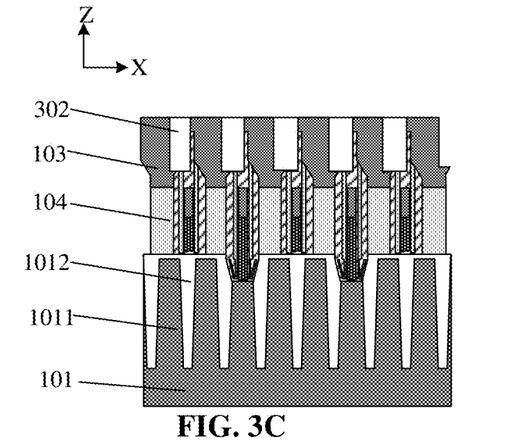

At S1021, first insulating layers are formed in the gaps, in which the first insulating layers are flush with the surfaces of the landing pads.

As shown in FIG. 3C, the gaps V2 are filled with an insulating material to form first insulating layers 302, in which the surface of each first insulating layer 302 is flush with the surfaces of the landing pads 103. The material of the first insulating layers 302 may be the same as or different from the material of the second insulating layer 301.

It is to be noted that, the process of forming the first insulating layers 302 in the embodiment of the application is the same as the process of forming the first insulating layer 106 in the above embodiment.

Figure 3D:
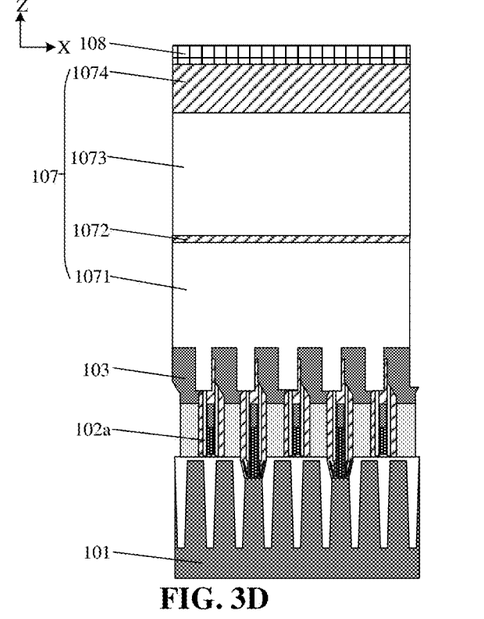

At S1022, a stack structure is formed on the surfaces of the plurality of landing pads and surfaces of the first insulating layers.

In the embodiment of the application, the stack structure may include a sacrificial layer and a supporting layer. As shown in FIG. 3D, a stack structure 107 is formed on the surfaces of the landing pads 103 and the surfaces of the first insulating layers 302. In the embodiment of the application, the stack structure 107 includes a first sacrificial layer 1071, a first supporting layer 1072, a second sacrificial layer 1073 and a second supporting layer 1074 sequentially stacked onto one another from bottom to top along the Z-axis direction.

At S1023, the stack structure and the first insulating layers are processed to form the capacitive structures.

In some embodiments, S1023 may be achieved through the following operations.

At S1, the stack structure is patterned to form capacitive holes in the stack structure on the surfaces of the plurality of landing pads.

In some embodiments, before S1 is executed, the method for forming the semiconductor structure also includes the following operation. A first mask layer is formed on a surface of the second supporting layer.

Please with reference to FIG. 3D, a first mask layer 108 is formed on the surface of the second supporting layer 1074.

In some embodiments, S1 may be achieved through the following operations.

At S11, the first mask layer is patterned.

Figure 3E:
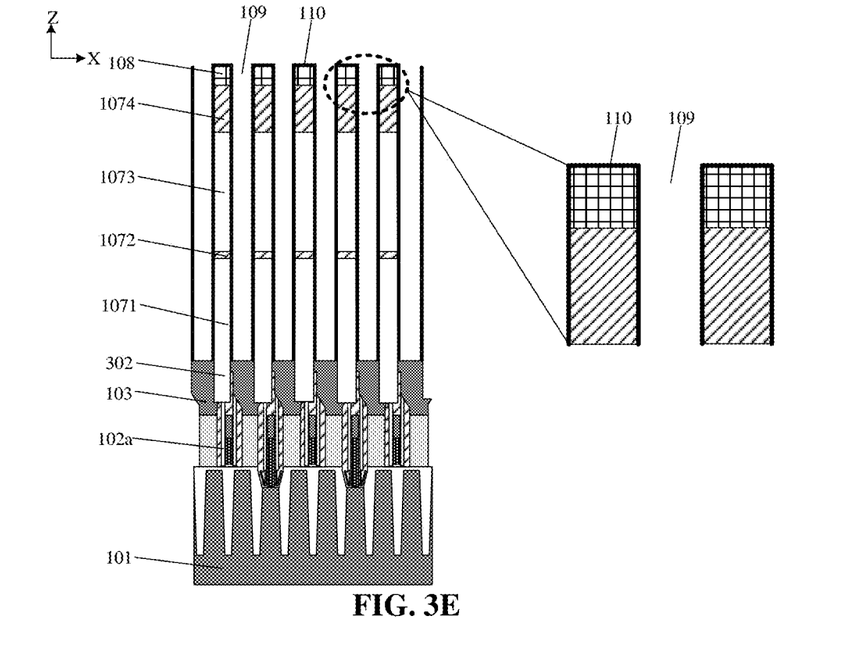

At S12, the second supporting layer, the second sacrificial layer, the first supporting layer and the first sacrificial layer on the surfaces of the plurality of landing pads are etched by using the patterned first mask layer as a mask to form a plurality of capacitive holes.

As shown in FIG. 3E, the second supporting layer 1074, the second sacrificial layer 1073, the first supporting layer 1072 and the first sacrificial layer 1071 located on the surfaces of the plurality of landing pads 103 are sequentially etched through the patterned first mask layer to form a plurality of capacitive holes 109.

At S2, first electrode layers are formed on inner walls of the capacitive holes and on a surface of the patterned stack structure.

Please with reference to FIG. 3E, first electrode layers 110 are formed on the inner walls of the capacitive holes 109 and on the surface of the patterned stack structure.

At S3, the supporting layer is patterned to form openings between adjacent capacitive holes.

At S4, the sacrificial layer and the first insulating layers are etched through the openings.

In some embodiments, the patterned stack structure includes the first sacrificial layer, the first supporting layer, the second sacrificial layer and the second supporting layer stacked onto one another, and the first mask layer and the first electrode layers are formed on the surface of the patterned stack structure. S3 and S4 may be achieved through the following operations.

Figure 3F:
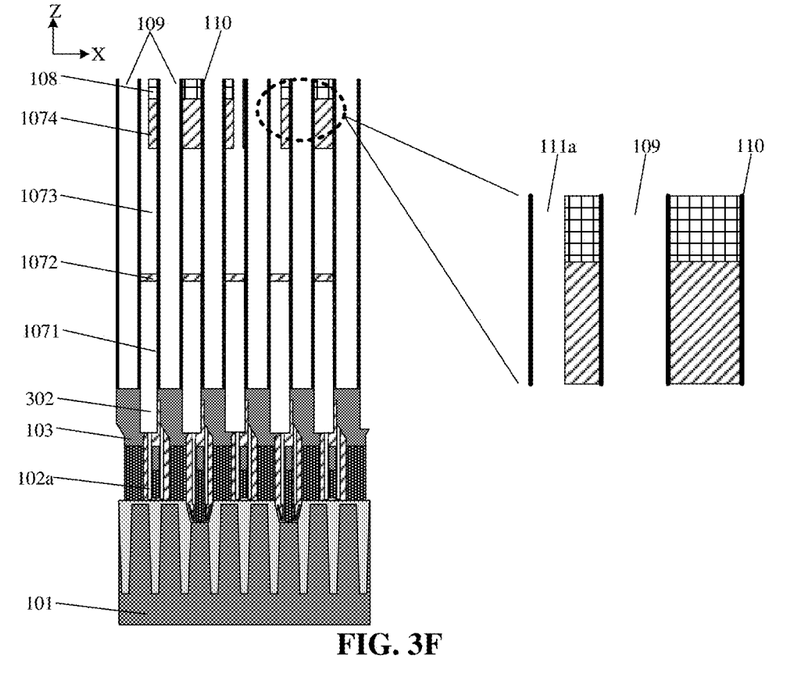

A first opening is formed in the first mask layer and the second supporting layer.

The second sacrificial layer is removed through the first opening.

As shown in FIG. 3F, a first opening 111a is formed in the first mask layer 108 and the second supporting layer 1074 by using a conventional etching process, and the second sacrificial layer 1073 is removed through the first opening 111a.

Figure 3G:
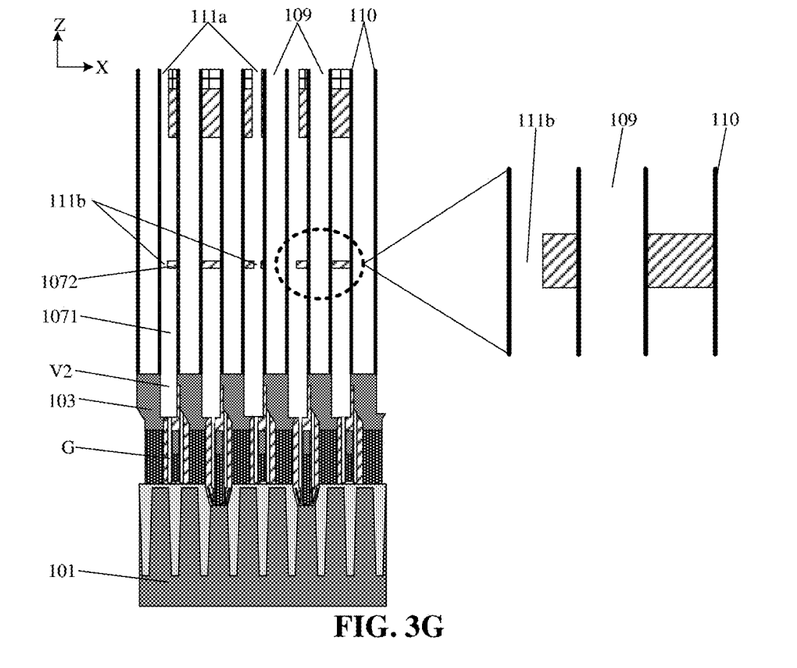

A second opening is formed in the first supporting layer.

The first sacrificial layer and the first insulating layer are removed through the second opening.

As shown in FIG. 3G, a second opening 111b is formed in the second supporting layer 1074 by using the conventional etching process, and the first sacrificial layer 1071 and the first insulating layer 302 are removed through the second opening 111b.

In the embodiment of the application, the first opening 111a and the second opening 111b may be formed by dry etching process, such as a plasma etching process.

In some embodiments, the sacrificial spacer layer 102a is connected with the first insulating layer 302, and the sacrificial spacer layer is removed when the first sacrificial layer and the first insulating layer are removed through the second opening.

Please with reference to FIG. 3G, a sacrificial spacer layer 102b on the side wall of each bit line structure 102 is removed when the first sacrificial layer 1071 and the first insulating layer 302 are removed, to form an air gap G located on each bit line structure or each bit line contact layer. The air gap communicates with the gap V2, and the air gap G may reduce the electric leakage of the semiconductor structure. In the embodiment of the application, the first sacrificial layer and the sacrificial spacer layer may be made of the same material or different materials.

At S5, the capacitive structures are formed in the patterned supporting layer.

In some embodiments, S5 may be achieved through the following operations.

Figure 3H:
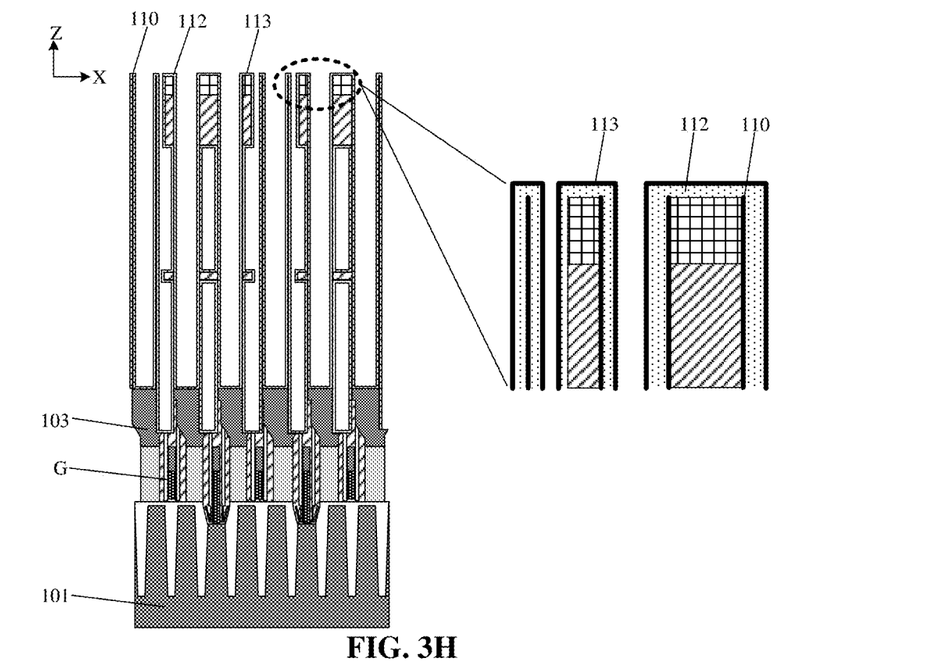

At S51, dielectric layers and second electrode layers are sequentially deposited on surfaces of the first electrode layers.

Figure 3I:
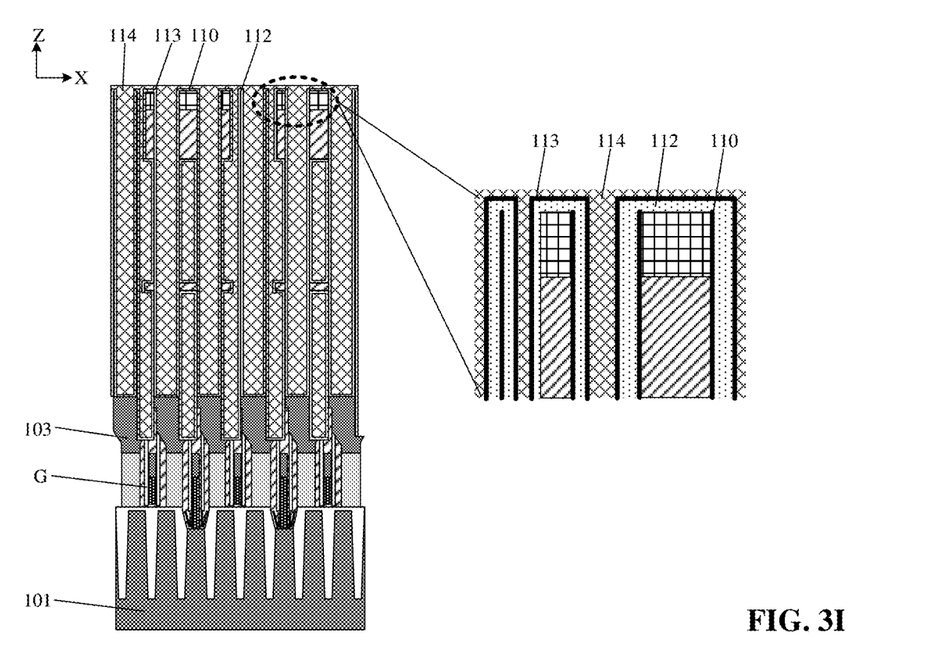

At S52, a conductive material that fills a clearance between the second electrode layers and covers an upper surface of the stack structure is deposited. The first electrode layers, the dielectric layers, the second electrode layers and the conductive material form the capacitive structures.

As shown in FIG. 3H, dielectric layers 112 and second electrode layers 113 are formed on the surfaces of the first electrode layers, and the dielectric layers 112 and the second electrode layers 113 are also configured to seal the air gaps G. As shown in FIG. 3J, a conductive material 114 is deposited in a clearance between the second electrode layers to form complete capacitive structures. The capacitive structures may include the first electrode layers 110, the dielectric layers 112, the second electrode layers 113 and the conductive material 114.

The method for forming the semiconductor structure in the embodiment of the application is similar to the method for forming the semiconductor structure in the above embodiment. The technical features not disclosed in detail in the embodiment of the application refer to the above embodiment for understanding, and will not be elaborated here.

In the method for forming the semiconductor structure provided in the embodiment of the application, since the capacitive structures are also formed in the gaps between adjacent landing pads, the semiconductor structure with relatively large charge capacity may be manufactured. Moreover, when the capacitive structures are formed in the semiconductor structure in the embodiment of the application, air gaps located on the side walls of the bit line structures are formed, so that the electric leakage performance of the semiconductor structure may be improved.

Figure 4A:
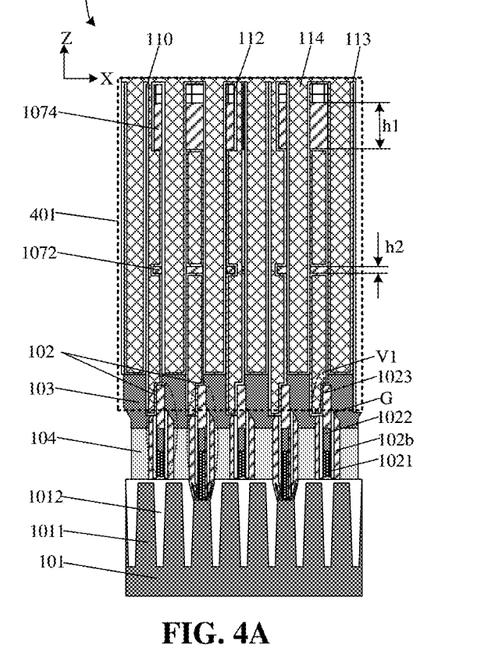
FIG. 4A is an optional schematic diagram of a semiconductor structure according to an embodiment of the application.
Figure 4B:
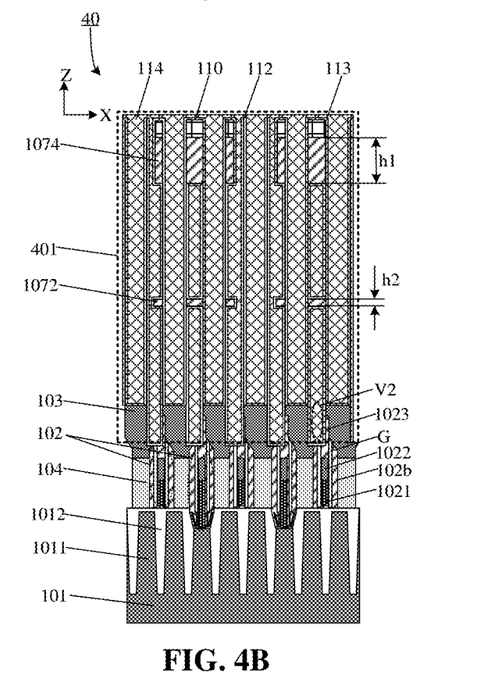
FIG. 4B is another optional schematic diagram of a semiconductor structure according to an embodiment of the application.

In addition, the embodiment of the application also provides a semiconductor structure. As shown in FIG. 4A and FIG. 4B, the semiconductor structure 40 includes a substrate structure and capacitive structures 401.

The substrate structure includes a plurality of bit line structures 102 arranged in parallel along the X-axis direction and a plurality of landing pads 103, and each of the plurality of landing pads is formed around a respective one of the bit line structures 102 and covers a part of the respective one of the bit line structures. A gap V1 or gap V2 is formed between each two adjacent landing pads 103. As shown in FIG. 4A, the section of each gap V1 along the XZ direction is stepped, and the Z-axis direction is perpendicular to the extension direction of the bit line structures 102 and the arrangement direction of the bit line structures 102 (i.e. the X-axis direction). Each of the bit line structures 102 includes a bit line contact layer 1021, a bit line metal layer 1022 and a bit line mask layer 1023 sequentially stacked onto one another from bottom to top along the Z-axis direction. As shown in FIG. 4B, the section of each gap V2 along the XZ direction is U-shaped. Each of the bit line structures 102 includes the bit line contact layer 1021, the bit line metal layer 1022 and a part of the bit line mask layer 1023 sequentially stacked onto one another from bottom to top along the Z-axis direction.

In some embodiments, the substrate structure also includes a semiconductor substrate 101. The semiconductor substrate 101 includes a plurality of active areas 1011 in array pattern and shallow trench isolation structures 1012 configured to isolate the active areas 1011 from each other. The bit line structures 102 are formed on the surfaces of the active areas 1011 and are in contact with the active areas 1011 through bit line contact structures. The substrate structure also includes storage node contacts 104, and each of the storage node contacts is formed around a respective one of the bit line structures 102 and in contact with a respective one of the landing pads 103.

In some embodiments, the substrate structure also includes a word line structure (not shown in the figure) buried in the semiconductor substrate 101.

The capacitive structures 401 are located on the top surfaces of the landing pads 103 and in the gaps V1 or gaps V2.

In some embodiments, the capacitive structures 401 include first electrode layers 110, dielectric layers 112 and second electrode layers 113 sequentially stacked onto one another, and a conductive material 114 is filled between adjacent second electrode layers 113.

In the embodiment of the application, the capacitive structures 401 have a cup shape, and the extension direction (Z-axis direction) of the capacitive structures is perpendicular to the top surfaces of the landing pads 103. A first supporting layer 1072 and a second supporting layer 1074 parallel to each other are also arranged between the capacitive structures 401. The first supporting layer 1072 is arranged on the middle periphery of the capacitive structures 401, the second supporting layer 1074 is arranged on the top periphery of the capacitive structures 401, and the first supporting layer 1072 and the second supporting layer 1074 are configured to support the capacitive structures 401.

In some embodiments, the thickness h1 of the second supporting layer 1074 is greater than the thickness h2 of the first supporting layer 1072, so that a better supporting effect may be achieved.

In some embodiments, the side wall of each bit line structure 102 is formed with a first spacer layer, a second spacer layer 102a and an air gap G between the first spacer layer and the second spacer layer 102b, herein, the air gap G is connected with a respective one of the dielectric layers 112.

The method for forming the semiconductor structure in the embodiment of the application is similar to method for forming the semiconductor structure in the above embodiment. The technical features not disclosed in detail in the embodiment of the application refer to the above embodiment for understanding and will not be elaborated here.

In the semiconductor structure provided in the embodiment of the application, the capacitive structures are not only located on the top surfaces of the landing pads, but also in the gaps between adjacent landing pads. In this way, the manufactured semiconductor structure may have relatively large charge capacity. Moreover, the semiconductor structure in the embodiment of the application is provided with an air gap located on the side wall of each bit line structure, so that the electric leakage performance of the formed semiconductor structure may be improved.

In several embodiments provided in the application, it should be understood that, the disclosed devices and methods may be realized in a non-target manner. The device embodiments described above are only schematic. For example, the division of the unit is only a logical function division, and there may be another division mode in actual implementation, for example, a plurality of units or components may be combined or integrated into another system, or some features may be ignored or not executed. In addition, the components shown or discussed are coupled to each other, or directly coupled.

The features disclosed in several methods or device embodiments provided by the disclosure may be combined arbitrarily without conflict to obtain new method embodiments or device embodiments.

The above are only some implementation mode of the embodiment of the disclosure and not intended to limit the scope of protection of the embodiment of the disclosure. Modifications or replacements are apparent to those skilled in the art within the technical scope disclosed by the embodiment of the disclosure, and these modifications or replacements shall fall within the scope of protection of the embodiment of the disclosure. Therefore, the scope of protection of the embodiment of the disclosure should be subject to the appended claims.

The invention claimed is:

1. A method for forming a semiconductor structure, comprising:
   providing a substrate structure, wherein the substrate structure at least comprises bit line structures and a plurality of landing pads, each of the plurality of landing pads is formed around a respective one of the bit line structures and covers a part of the respective one of the bit line structures, and a gap is formed between each two adjacent landing pads of the plurality of landing pads; and
   forming capacitive structures on top surfaces of the plurality of landing pads and in the gaps.

2. The method of claim 1, forming the capacitive structures on the top surfaces of the plurality of landing pads and in the gaps comprising:
   forming first insulating layers in the gaps, the first insulating layers being flush with surfaces of the plurality of landing pads;
   forming a stack structure on the surfaces of the plurality of landing pads and surfaces of the first insulating layers; and
   processing the stack structure and the first insulating layers to form the capacitive structures.

3. The method of claim 2, wherein the stack structure comprises a sacrificial layer and a supporting layer, wherein processing the stack structure and the first insulating layers to form the capacitive structures comprises:
   patterning the stack structure to form capacitive holes in the stack structure on the surfaces of the plurality of landing pads;
   forming first electrode layers on inner walls of the capacitive holes and on a surface of the patterned stack structure;
   patterning the supporting layer to form openings between adjacent capacitive holes;
   etching the sacrificial layer and the first insulating layers through the openings; and
   forming the capacitive structures in the patterned supporting layer.

4. The method of claim 3, forming the capacitive structures in the patterned supporting layer comprising:
   sequentially depositing dielectric layers and second electrode layers on surfaces of the first electrode layers; and
   depositing a conductive material filling a clearance between the second electrode layers and covering an upper surface of the stack structure, wherein the first electrode layers, the dielectric layers, the second electrode layers and the conductive material form the capacitive structures.

5. The method of claim 4, wherein the sacrificial layer comprises a first sacrificial layer and a second sacrificial layer, and the supporting layer comprises a first supporting layer and a second supporting layer,
   wherein the method further comprises: forming a first mask layer on a surface of the second supporting layer,
   wherein patterning the stack structure to form capacitive holes in the stack structure on the surfaces of the plurality of landing pads comprises:
   patterning the first mask layer; and
   etching the second supporting layer, the second sacrificial layer, the first supporting layer and the first sacrificial layer on the surfaces of the plurality of landing pads by using the patterned first mask layer as a mask to form the capacitive holes.

6. The method of claim 5, wherein the patterned stack structure comprises the first sacrificial layer, the first supporting layer, the second sacrificial layer and the second supporting layer stacked onto one another, and the first mask layer and the first electrode layers are formed on the surface of the patterned stack structure,
   wherein patterning the supporting layer to form openings between adjacent capacitive holes and etching the sacrificial layer and the first insulating layers through the openings comprise:
   forming a first opening in the first mask layer and the second supporting layer;
   removing the second sacrificial layer through the first opening;
   forming a second opening in the first supporting layer; and
   removing the first sacrificial layer and the first insulating layer through the second opening.

7. The method of claim 6, wherein the first opening and the second opening are formed through a dry etching process.

8. The method of claim 6, wherein a side wall of each bit line structure is formed with a first spacer layer, a second spacer layer and a sacrificial spacer layer located between the first spacer layer and the second spacer layer, and the first insulating layer is connected with the sacrificial spacer layer, wherein the method further comprises:
removing the sacrificial spacer layer when the first sacrificial layer and the first insulating layer are removed through the second opening,
wherein the first sacrificial layer and the sacrificial spacer layer are formed of a same material.

9. The method of claim 8, wherein the second sacrificial layer, the first sacrificial layer, the first insulating layer and the first spacer layer are removed through a wet etching process.

10. The method of claim 8, wherein the substrate structure further comprises storage node contacts, and each of the storage node contacts is formed around a respective one of the bit line structures and is in contact with a respective one of the plurality of landing pads, wherein the plurality of landing pads and the gaps are formed by:
forming a conductive layer covering the bit line structures on a surface of each storage node contact, wherein a top surface of the conductive layer exceeds a top surface of each bit line structure;
forming a patterned second mask layer on a surface of the conductive layer; and
etching a part of the conductive layer and a part of the first spacer layer through the patterned second mask layer until the sacrificial spacer layer is exposed, to form the plurality of landing pads located on surfaces of the storage node contacts and the gaps between adjacent landing pads, wherein a section of each gap along a first direction is stepped, and the first direction is perpendicular to an extension direction of the bit line structures and an arrangement direction of the bit line structures.

11. The method of claim 8, wherein each of the bit line structures comprises a bit line contact layer, a bit line metal layer and a bit line mask layer which are sequentially stacked onto one another from bottom to top along a first direction, and the first direction is perpendicular to an extension direction of the bit line structures and an arrangement direction of the bit line structures, wherein the method further comprises:
forming a second insulating layer between each two adjacent landing pads of the plurality of landing pads, wherein the second insulating layer is flush with the surfaces of the plurality of landing pads; and
etching the second insulating layer and a part of the bit line mask layer to form the gaps, wherein a section of each gap along the first direction is U-shaped.

12. A semiconductor structure, comprising:
a substrate structure, wherein the substrate structure at least comprises bit line structures and a plurality of landing pads, each of the plurality of landing pads is formed around a respective one of the bit line structures and covers a part of the respective one of the bit line structures, and a gap is formed between each two adjacent landing pads of the plurality of landing pads; and
capacitive structures located on top surfaces of the plurality of landing pads and in the gaps.

13. The semiconductor structure of claim 12, wherein a section of each gap along a first direction is stepped, the first direction is perpendicular to an extension direction of the bit line structures and an arrangement direction of the bit line structures, each of the bit line structures comprises a bit line contact layer, a bit line metal layer and a bit line mask layer which are sequentially stacked onto one another from bottom to top along the first direction; or
a section of each gap along the first direction is U-shaped, each of the bit line structures comprises the bit line contact layer, the bit line metal layer and a part of the bit line mask layer which are sequentially stacked onto one another from bottom to top along the first direction.

14. The semiconductor structure of claim 12, wherein the capacitive structures comprise first electrode layers, dielectric layers and second electrode layers stacked onto one another, and a conductive material is filled between adjacent second electrode layers.

15. The semiconductor structure of claim 14, wherein the capacitive structures have a cup shape, an extension direction of the capacitive structures is perpendicular to the top surfaces of the plurality of landing pads, a first supporting layer and a second supporting layer parallel to each other are arranged between the capacitive structures,
wherein the first supporting layer is arranged on a middle periphery of the capacitive structures, the second supporting layer is arranged on a top periphery of the capacitive structures, and the first supporting layer and the second supporting layer are configured to support the capacitive structures.

16. The semiconductor structure of claim 15, wherein a thickness of the second supporting layer is greater than a thickness of the first supporting layer.

17. The semiconductor structure of claim 14, wherein a side wall of each bit line structure is formed with a first spacer layer, a second spacer layer and an air gap between the first spacer layer and the second spacer layer, wherein the air gap is connected with a respective one of the dielectric layers.

* * * * *